Figure 1:
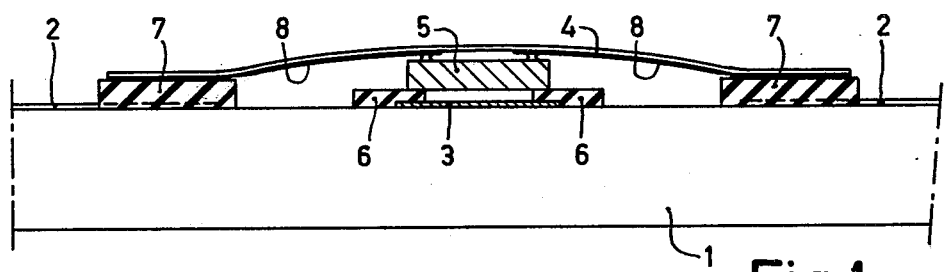

United States Patent [19]

Schermer et al.

[11] 4,180,828
[45] Dec. 25, 1979

[54] HYBRID CIRCUIT HAVING A SEMICONDUCTOR CIRCUIT

[75] Inventors: Gijsbertus J. H. Schermer; Hubertus H. A. Winters; Willem C. Hildering; Karl F. Nickl von Nikelsberg, all of Eindhoven, Netherlands

[73] Assignee: U.S. Philips Corporation, New York, N.Y.

[21] Appl. No.: 899,070

[22] Filed: Apr. 24, 1978

[30] Foreign Application Priority Data

Feb. 5, 1977 [NL] Netherlands .................. 7704773

[51] Int. Cl.² ........................................ H01L 23/42
[52] U.S. Cl. .................................. 357/79; 357/68; 357/80; 357/71
[58] Field of Search .................. 357/79, 80, 68, 71

[56] References Cited
U.S. PATENT DOCUMENTS 3,916,435 10/1975 Camplin et al. .................. 357/79
4,009,485 2/1977 Koenig .................................. 357/79

Primary Examiner—Edward J. Wojciechowicz
Attorney, Agent, or Firm—Thomas A. Briody; Edward J. Connors, Jr.; Paul R. Miller

[57] ABSTRACT

A hybrid circuit comprises an insulating substrate which is provided with conductors and on which a semiconductor circuit is provided consisting of a semiconductor element connected to an insulating flexible foil having conductor tracks, and in which the side of the semiconductor element remote from the foil bears on spacers of the substrate. Connection material fills entirely the space between the semiconductor element and the substrate, while near connection sites of the foil to the substrate elongated spacers on which side edges of the foil bear are provided on the substrate between conductors, and the space between the elongate spacers is filled with connection material which connects the ends of the conductor tracks to the conductors of the substrate.

4 Claims, 3 Drawing Figures

HYBRID CIRCUIT HAVING A SEMICONDUCTOR CIRCUIT

The invention relates to a hybrid circuit comprising an insulating substrate which is provided with conductors, and a semiconductor circuit is provided on the substrate consisting of a semiconductor element which is connected to an insulating flexible foil having conductor tracks with the side of the semiconductor element remote from the foil being secured to the substrate and ends of the conductor tracks on the foil being connected to the conductors of the substrate.

Such a hybrid circuit is known, for example, from Netherlands Pat. application No. 69 15 992. In this application the semiconductor element is secured to the substrate by means of solder or a conductive adhesive, and the ends of the conductor tracks of the foil are soldered to conductors on the substrate. The problem may occur that during connection, solder or conductive adhesive is pushed away from below the semiconductor element and forms a shortcircuit with the conductor tracks of the foil. In order to prevent considerable pushing away of solder or adhesive during a connection, it has already been proposed to place unfastened spacers between a semiconductor element and a substrate. However, this solution is complicated and is not suitable for use in series production.

Because of desired small dimensions of the semiconductor circuit the ends of the conductor tracks near edges of the foil are situated closely together. The connection of the conductor ends to conductors on the substrate is preferably a soldered joint. In this case it is also very difficult to prevent pushing away of solder during the connection so that the possibility of shortcircuit is large at these areas.

It is the object of this invention to provide a hybrid circuit of the kind mentioned in the preamble in which the problem of a shortcircuit which may result from assembling the semiconductor element on the substrate, is solved efficaciously and the foil with the semiconductor element can be secured to the substrate in a simple manner.

In order to obtain this end according to the invention, spacers are formed on the substrate near the connection site of the semiconductor element. The spacers are situated at least partly below or beneath the semiconductor element with the semiconductor element bearing on them, and connection material entirely fills the space between the semiconductor element and the substrate. Elongated spacers are provided between conductors on the substrate near the connection sites of the foil to the substrate on which spacers side edges of the foil bear, and the space between the elongated spacers is filled with electrically conductive connection material connecting the ends of the conductor tracks to conductors of the substrate.

The spacers below the semiconductor element constitute bearing surfaces, and their height accurately determines the distance between the semiconductor element and the substrate. As a result of this defined height, a quantity of connection material, for example solder or adhesive, may be used so that the connection surface of the semiconductor element is connected entirely or substantially entirely to the substrate, and shortcircuits of the conductor tracks of the foil are avoided with certainty. A soldered or adhered joint of sufficient thickness is beneficial for preventing thermal fatigue of the connection. Elongated spacers situated between the conductors on the substrate at the area of the connection to the foil prevent any intermediately located connection material, for example solder, from being pushed aside by the foil. A connection is formed between the conductors and the conductor tracks, so that it is impossible for shortcircuits to occur between adjacent conductors. A suitable height of the elongated spacers furthermore reduces bending of the foil and hence eliminates stresses in the foil.

In one embodiment the spacers are formed in a strip form being mainly rectangular and having a finger-shaped part extending to below the semiconductor element from the inner sides and which has a number of further finger-shaped parts extending from at least two oppositely located outer sides in the direction of the foil edges. This construction of the pattern of spacers is advantageous in that one or more conductors may be situated below the rectangular strip and they cannot contact the conductor tracks on the foil.

In a substrate for a hybrid circuit, conductors, resistors, and dielectric are often provided in thick film technique by means of a silk screening process. According to another embodiment of the invention the spacers are formed from a thick film of material which is also used on the substrate for further purposes. Thus, the spacers may now be provided simultaneously with provision of thick film layers necessary for further purposes on the device and no separate process step is necessary for manufacture.

The invention will be described in greater detail with reference to the drawing.

In the drawing

Figure 2:
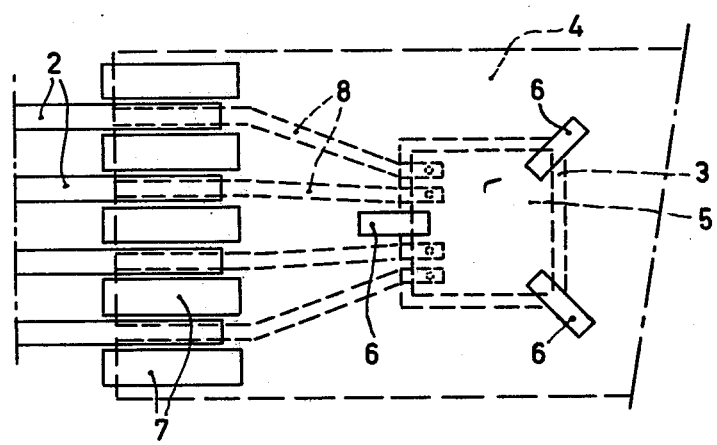
Figure 3:
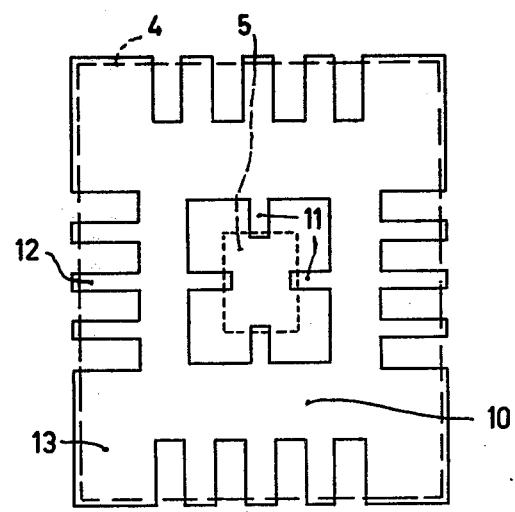

FIG. 1 is a sectional view of a part of a hybrid circuit showing a connection of the foil to the semiconductor element, FIG. 2 is a plan view of a part of FIG. 1, and FIG. 3 is a plan view of an embodiment having the spacers in strip form on the substrate.

The embodiment shown in FIG. 1 comprises an insulating substrate 1 having conductors 2 and 3 in which the substrate consists, for example, of aluminium oxide and the conductors consist, for example, of a palladium-silver layer. Usually, further coatings, not shown, are provided on such a substrate in a thick-film technique, for example, by means of a screen-printing process. These coatings may consist of further conductors, resistors and insulating layers, such as glass, provided in a desired pattern. Simultaneously with, for example, an insulating layer, a pattern of spacers 6, 7 may also be formed near the connection place of a semiconductor circuit which consists of an insulating flexible foil 4 supporting a semiconductor element 5. The foil 4 is, for example, a polyimide having a thickness of 25 microns, on which conductor tracks 8 are present with a thickness of 8 microns. FIG. 2 is a partial plan view of a possible pattern of spacers 6, 7 of insulating material. FIG. 3 shows another embodiment.

In FIGS. 1 and 2 the spacers are formed as beams 6 and 7. The foil 4 is placed with its side edges on the spacers 7, and the semiconductor element bears on ends of the spacers 6. At the area of the connection of the semiconductor element, for example, solder is provided on the substrate, for example, by means of a silk screening process. The solder surface is chosen to be smaller than the surface of the semiconductor element, but its height is made larger than the thickness of the beams 6.

Solder is also provided above the conductors and fills the space between the elongated spacer beams 7.

The side of the semiconductor element remote from the foil 4 pushes the solder aside during connection to the substrate until the semiconductor element 5 bears on the spacers 6. The solder will then be pushed out to approximately the edge of the semiconductor element 5; and any possibility of shortcircuit with conductor tracks on the foil is excluded.

The ends of the conductor tracks 8 on the foil 4 are secured to the conductors 2 of the substrate 1 by means of solder provided between the spacer beams 7. The spacer beams 7 prevent solder from forming a shortcircuit between adjacent conductors 2.

The distance between the semiconductor element 5 and the substrate 1 and hence the thickness of the spacers 6 is preferably chosen to be between 20 and 40 microns. The thickness of, for example, screen-printed solder paste then is approximately 150 to 200 microns, the paste containing 40% by volume of solder powder. The original solder surface preferably has a size smaller than 50% of the surface of the semiconductor element.

FIG. 3 shows an embodiment of the pattern of spacers. The external dimensions of the pattern correspond approximately to the dimensions of the foil 4. A rectangular strip 10 comprises four inwardly projecting finger-shaped parts 11 on which the semiconductor element is to bear. On the outside the strip comprises finger-shaped parts 12 and corner members 13 on which the sides of the foil bears. The solder for the connection of the conductors to the foil conductor tracks is provided between the parts 12. This pattern which consists of one assembly is simple to provide. The strip-shaped parts 10 form extra protection against shortcircuit between the foil conductor tracks and possible further conductors on the substrate.

In the drawing the spacers are shown as elongated parts. This is not necessary for the spacers supporting the semiconductor element. Any desired shape may be used, for example, at least three small bosses present only below the semiconductor element. Nor need the material of the spacers at that area be insulating; they may be of resistance material or electrically conductive material. Furthermore, instead of solder use may be made alternatively of a joint formed by adhesion which is electrically and/or thermally conductive.

What is claimed is:

1. A hybrid circuit comprising
   an insulating substrate having a plurality of conductors formed on a surface thereof,
   a semiconductor circuit provided on said substrate surface and including a semiconductor element and an insulating flexible foil connected to said semiconductor element at a side remote from said substrate, said foil having conductor tracks associated with said substrate conductors,
   spacers including first spacers on said substrate surface with said semiconductor element bearing thereon, and second spacers provided between adjacent ones of said substrate conductors with side edges of said foil bearing thereon,
   connecting material filling the space between said semiconductor element and said substrate surface, and
   conducting material filling the spaces between said second spacers to connect said foil conductor tracks and said substrate conductors.

2. A hybrid circuit as claimed in claim 1, wherein said substrate conductors include parallel elongated conductor members, and said second spacers are elongated insulating members.

3. A hybrid circuit as claimed in claim 1, wherein said spacers are formed as a strip being generally rectangular, said strip having finger-shaped parts extending from inner sides of said strip to form said first spacers, and having further finger-shaped parts extending from at least two oppositely located outer sides of said strip to form said second spacers.

4. A hybrid circuit as claimed in claims 1, 2 or 3, wherein said spacers are formed on said substrate surface as part of a thick film material being used on said substrate for further purposes.

* * * * *